United States Patent [19]

Reick

[11] 4,085,365

[45] Apr. 18, 1978

[54] EARPHONE ADAPTER FOR AIRCRAFT RADIOS

[75] Inventor: Franklin G. Reick, Westwood, N.J.

[73] Assignee: Michael Ebert, Mamaroneck, N.Y.; a part interest

[21] Appl. No.: 616,361

[22] Filed: Sep. 24, 1975

[51] Int. Cl.² .............................................. H04B 1/40
[52] U.S. Cl. .................................... 325/21; 179/1 H; 325/485; 325/496
[58] Field of Search ............... 179/1 R, 1 A, 1 H, 37; 325/18, 21, 22, 318, 319, 485, 492, 308, 310, 352, 361, 15, 16, 19; 330/12, 16, 20

[56] References Cited

U.S. PATENT DOCUMENTS

| | | | |
|---|---|---|---|
| 2,496,398 | 2/1950 | Lambert | 179/37 X |
| 3,258,695 | 6/1966 | Brown et al. | 325/319 X |
| 3,320,365 | 5/1967 | Auernheimer | 179/1 A |
| 3,586,977 | 6/1971 | Lustig et al. | 325/18 X |
| 3,592,967 | 7/1971 | Harris | 179/1 A |
| 3,855,534 | 12/1974 | Holcomb et al. | 325/492 X |
| 3,896,379 | 7/1975 | Voss et al. | 325/21 |

OTHER PUBLICATIONS

QST for Sept. 1953, p. 51, "A Transistor M.C.W. Adapter", by H. V. Braun.

*Primary Examiner*—Benedict V. Safourek

[57] ABSTRACT

An adapter making it possible for the pilot of an aircraft equipped with a navigation-communication system whose audio output is permanently connected to a loudspeaker to hear well with ordinary earphones without interfering with the concurrent operation of the loudspeaker. The adapter is constituted by a battery-operated Darlington amplifier whose high-impedance input is connected across the relatively low impedance audio output of the system whereby virtually no load is imposed thereon. The low-impedance output of the amplifier is connected to the earphones in series with a volume control resistor whereby a reduction in volume results in a diminished current drain, thereby prolonging battery life. A redundant power supply is provided constituted by two cells and a switch adapted to connect either of the cells individually or both cells in series to the amplifier so that even after both cells are close to exhaustion, they are still capable of powering the amplifier.

5 Claims, 4 Drawing Figures

To Radio Receiver

To Radio Receiver

To Transmitter

EARPHONE ADAPTER FOR AIRCRAFT RADIOS

BACKGROUND OF INVENTION

This invention relates generally to aircraft radio systems, and more particularly to an adapter, making it possible for a pilot to hear well with ordinary earphones without interfering with concurrent loudspeaker operation, the adapter also functioning as an intercom within the aircraft.

The flow of aircraft traffic is mostly in an airway pattern that is aligned with ground-based, very high-frequency omnidirectional radio ranges and distance-measuring systems. These navigational facilities supply the pilots of equipped aircraft with information on the bearing to or from the ground station and the distance thereto. Navigational systems are also employed for en route and instrument approach purposes, the navigation function being normally performed in the aircraft by the pilot or navigator.

Flight information as well as advisory, weather, flight-plan revisions and control information are handled by high-frequency voice communication transceiver channels between the plane and air-route traffic-control centers, airport towers and air-traffic communications stations.

The main concern of the present invention is with navigation-communications equipment of the type installed in small private planes in general aviation, usually propeller-driven, as distinguished from equipment for large passenger planes, generally of the jet type, used in commercial aviation.

In a private plane, it is the usual practice to feed the audio output of the navigation-communication system into a loudspeaker, so that all incoming intelligence may be heard by the pilot and all other occupants of the plane, including in some instances a co-pilot or navigator. In a typical private plane, there is little acoustic insulation and the ambient noise level is extraordinarily high, for one is subjected not only to the loud whirring of the propellers and the engine noises but also to wind sounds.

The output of the loudspeaker is in direct competition with such ambient noise. Even with the speaker volume turned up to override ambient noise, it is still quite difficult for the pilot and other occupants of the plane to discriminate between intelligence issuing from the loud speaker and noise.

Nevertheless, it is not the present custom for pilots to listen on earphones to the navigation-communication system. With properly padded earphones, one obtains a marked reduction of ambient sound so that the pilot is then able to clearly hear the incoming intelligence, more or less to the exclusion of ambient noise. But ambient noise is not entirely a distraction to be fully excluded, for it is important for the pilot to listen to such noise so that he can quickly detect irregularities in engine performance and take the necessary corrective measures.

Even though the pilot experiences difficulty in hearing intelligence over the loudspeaker and has available an earphone jack on his equipment, he rarely uses earphones. One reason why pilots have heretofore found the use of earphones objectionable despite their obvious advantages over a loudspeaker in a cockpit environment is the earphones specially designed to operate with the installed system are expensive and are not usually usable in another installation.

An uninterrupted speaker operation is essential so that all occupants of the plane have the benefit of the communicated intelligence; hence one does not disconnect the speaker when listening on the phones. But in the conventional aircraft system, the earphones and the loudspeaker both impose a load on the same audio output, so that if the volume control for the system is set to a level suitable to the pilot listening on the phones, it will not result in a satisfactory operating level for the loudspeaker, and vice-versa.

Because each aircraft navigation-communication system is designed for a particular type of head-set, with existing arrangements the pilot cannot interchangeably use a head-set whose impedance is intended to match the output impedance of a given aircraft system with the audio output of another system. Nor is it possible to use an inexpensive head-set adapted say for use with a stereo phonograph amplifier, with an aircraft system. These factors have discouraged the use of head-sets.

As a consequence, most general aviation pilots forego the use of earphones and the advantages to be gained therefrom, and try, as best they can, to extract information from the loudspeaker. Inasmuch as there are situations where the communication of intelligence may be vital to safety, the inability to hear clearly is a serious drawback and may endanger the lives of a pilot and his passengers.

Another drawback of existing communication systems is that the pilot in a small plane has no means of communicating with a co-pilot or a passenger, save by shouting to be heard over the ambient noise. This can be exhausting to the pilot, particularly if he is seeking to instruct a student pilot.

SUMMARY OF INVENTION

In view of the foregoing, it is the main object of this invention to provide an adapter making it possible for a pilot to use earphones in connection with an aircraft navigation-communication system without in any way affecting the existing operation of a loudspeaker coupled to the same system output.

More particularly, it is an object of this invention to provide a highly-compact adapter of the above-type which includes an amplifier having an exceptionally high input impedance, whereby the connection thereto across the output circuit of the aircraft system which is coupled to the loudspeaker imposes virtually no load thereon and therefore does not appreciably reduce the current fed to the speaker.

A significant advantage of the invention is that the amplifier in the adapter includes its own volume control which may be set to a level suitable for the wearer of the head-set coupled to the output thereof, whereby the level of sound in the head-set may be adjusted without regard to the existing level of loudspeaker sound. Inasmuch as the aircraft system also includes a volume control, it becomes possible to adjust the relative sound levels of the speaker and the head-set so that these levels are at their optimum values for individual and collective hearing.

Also an object of this invention is to provide a battery power supply for a head-set adapter, which supply is fully redundant to ensure prolonged operating life.

Yet another object of the invention is to provide an inexpensive adapter which is usable with any available set of earphones, including a low-cost head-set.

It is still another object of the invention to provide an adapter which also functions as an intercom, making it possible for two wearers of head sets coupled to the adapter to speak to each other through microphones coupled to the input of the adapter. The microphones may also be used to transmit over the communication system.

Briefly stated, these objects are attained in an adapter which in its simplest embodiment is constituted by a current amplifier having a high-input impedance, preferably in a Darlington configuration, the low-impedance input of the amplifier being connected to a plug insertable into the phone jack of an aircraft navigation-communication system, the output of the amplifier having a standard phone jack adapter to receive the plug of a head-set.

The volume control of the amplifier is in the form of a variable resistor connected in series with the earphones in the output circuit, whereby a reduction in volume diminishes the current drain by the amplifier and thereby increases battery life. The amplifier is operated from a single power cell, but a pair thereof is provided in a redundant switching arrangement whereby when one cell is close to exhaustion, it may be supplanted by the other cell, and when the second cell is almost exhausted, both nearly-exhausted cells may then be connected in series to provide a combined voltage sufficient to maintain the amplifier in operation. In practice, the head-set may be composed of a single earphone so that the pilot can also hear ambient noise, or it may be composed of two earphones connected in series to further reduce the current drain on the battery.

In a second embodiment of the adapter, a pair of earphones is coupled to the output of the Darlinton amplifier, each wearer of the head-set being provided with a microphone coupled to the high-impedance input of the Darlington amplifier through a buffer amplifier to provide an intercom arrangement, making it possible for the wearers to talk to each other.

In a third embodiment of the invention, the output of the buffer amplifier is connectable to the transmitter of the aircraft communication system so that either head-set wearer may transmit to an airport tower or other station.

OUTLINE OF DRAWINGS

For a better understanding of the invention as well as other objects and further features thereof, reference is made to the following detailed description to be read in conjunction with the accompanying drawings, wherein.

DESCRIPTION OF INVENTION

First Embodiment

Figure 1:
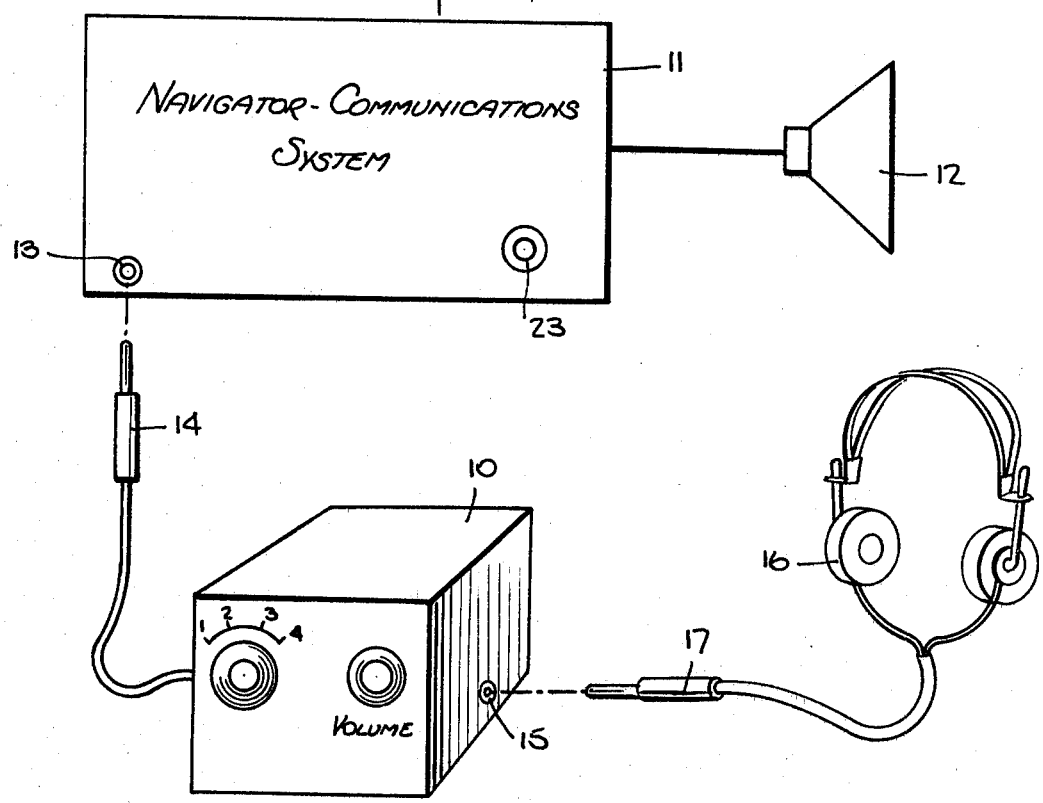
FIG. 1 is a block diagram of a first preferred embodiment of an adapter in accordance with the invention.
Figure 2:
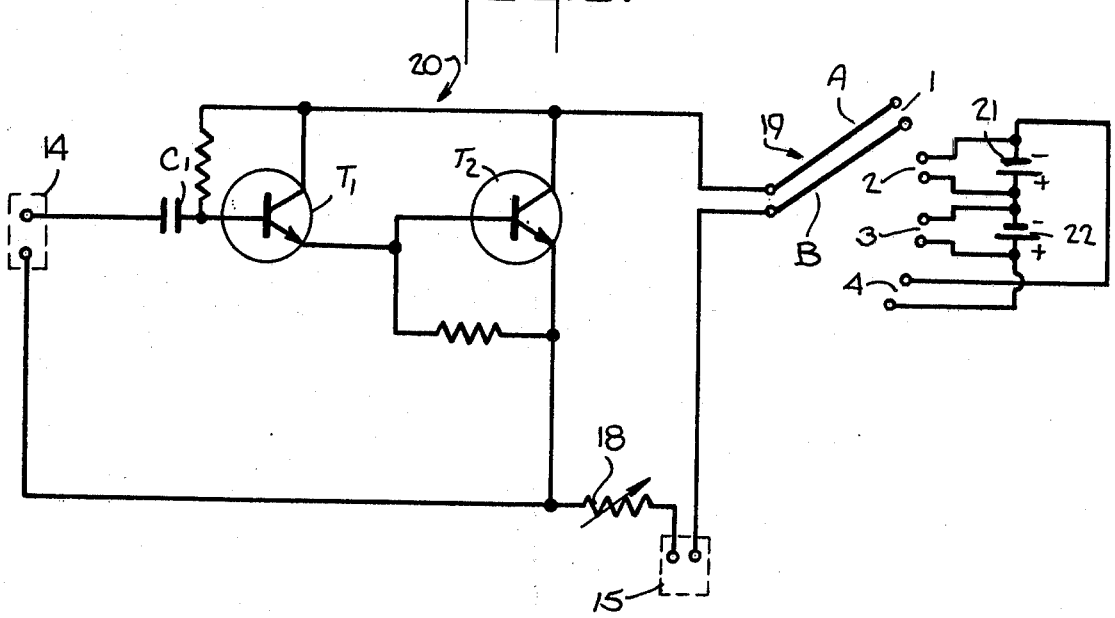
FIG. 2 is a schematic circuit diagram of the adapter.

Referring now to FIGS. 1 and 2, there is shown an adapter in accordance with the invention, generally designated by numeral 10, the adapter being operable with any existing form of navigation-communication system 11 installed on a plane. The communication system includes a transmitter and a receiver. The audio output of the receiver is supplied to a loudspeaker 12 so that the pilot and all occupants of the aircraft can collectively hear incoming intelligence. The system may also include a jack 13 for earphone use, the jack being connected to the audio output. In those instances where a jack is not provided, then the adapter must be connected to the appropriate audio output terminals of the system.

Adapter 10 incorporates a battery-operated amplifier 20, preferably constituted by a Darlington configuration having a high-input impedance. Amplifiers of this type are commercially available in integrated chip form, such as an RCA SKP 0048. The imput circuit of the amplifier is connected to a phone plug 14 insertable into a navigation-communication system jack 13 so as to couple the audio output of the system to the adapter amplifier. The adapter is provided with its own jack 15 connected to the output of the amplifier so that a pilot wearing a head-set 16 provided with a plug 17 may plug into jack 15 to listen. The head-set may be of any available commercial type and need not be expressly designed for the adapter.

Adapter 10 further includes a volume control 18 and a four-position selector switch 19 operating in conjunction with a pair of power cells 21 and 22 which, in practice, may be 1.5 volt flashlight batteries. Selector switch 19 is of the double-pole type and the movable contacts A and B thereof serve to connect the batteries to the amplifiers in a redundant arrangement.

At switch position 1, the movable contacts A and B engage a pair of fixed contacts which are unconnected; hence this is the off-position of the switch. At position 2, the movable contacts engage a pair of fixed contacts connected to battery 21 so that the amplifier is then powered solely by this battery. At position 3, a pair of fixed contacts connected to battery 22 are engaged to power the amplifier solely by this battery.

In practice, the amplifier is first operated at switch position 2 until such time as a reduction in volume indicates that battery 21 is approaching exhaustion, at which point the pilot switches in fresh battery 22 at position 3. When battery 22 gives evidence that it is approaching exhaustion, then the pilot switches movable contacts A and B to position 4 where the pair of fixed contacts are connected to battery cells 21 and 22 in series.

With fresh 1.5 volt batteries, the series-connected batteries at position 4 would provide a 3 volt output rather than the 1.5 volts required for amplifier operation. But with nearly-exhausted batteries, the combined output is usually between 1 and 2 volts and is sufficient to sustain the amplifier until such time as the batteries can be replaced.

The Darlington amplifier 20 is a current amplifier formed by two transistors $T_1$ and $T_2$ preferably mounted in a single chip, the amplifier having the same termination as a single transistor. As pointed out previously, it is necessary to impose virtually no loan on the output circuit of the navigation-communication system 11 so that the coupling of earphones thereto will in no way affect the operation of loudspeaker 12 already coupled to the output circuit. To accomplish this, the input impedance of the amplifier must be extremely high. While an extremely high impedance may be obtained without difficulty using vacuum tubes, the normal impedance of transistor amplifiers is several orders of magnitude below that of vacuum tube amplifiers.

But with a Darlington configuration, the first transistor $T_1$ is working at an extremely low collector current, for its emitter current is the base current of the second transistors $T_2$ and the input impedance is extremely high (i.e., 1 megohm). The addition of shunt resistor $R_1$ between the base and emitter of the second transistor $T_2$ results in a substantial increase in gain. A capacitor $C_1$ is connected in series with the input circuit of the amplifier to decouple it from system 11 with respect to d-c.

Volume control 18 is a variable resistor connected in series with earphones 16 in the low-impedance output of amplifier 20, so that the current drain depends on the volume setting. The lower the volume, the less current is drawn from the battery and the longer is the battery life.

The navigation-communication system includes its own audio volume control 23, and this is set to provide a sound level for the loudspeaker suitable to prevailing conditions in the plane. The adjusted volume level of the loudspeaker is in no way affected by plugging in the adapter 10, for its extremely high impedance input is grossly unmatched with the normal low impedance audio output of the system, and the load imposed on the system by the adapter is insignificant. However, the mismatch between the system and the adapter, which results in a very low signal input, is compensated for by the high gain of the amplifier. The sound level of the earphones may be set by the amplifier volume control 18 to suit the pilot's convenience without regard to the volume level setting of loudspeaker 12 produced by volume control 23.

It will be appreciated that by plugging earphones directly into the audio output of the navigation-communication system, this provides ample volume for the phones when the impedance of the phones is reasonably matched to the output impedance of the system so that a separate amplifier for the phones serves no useful purpose if one disregards the effect of the phones on the operation of the loudspeaker. The purpose in interposing a mismatched amplifier between the system output of the phones is to prevent the use of the phones from adversely affecting the loudspeaker operation and to make it possible to use any available set of headphones.

Second Embodiment

In the first embodiment, the adapter makes it possible to listen to the audio output of the aircraft radio on earphones, the adapter having no other function. In the second embodiment shown in FIG. 3, the adapter includes a buffer amplifier, constituted by transistors $T_3$ and $T_4$, which cooperates with the Darlington amplifier formed by transistors $T_1$ and $T_2$ to render the adapter also effective as an intercom without in any way interfering with the listening capability of the adapter.

In this arrangement, a pair of earphones 16A and 16B are plugged into the output of the Darlington amplifier so that two wearers (say the pilot and co-pilot) can listen to the audio output of the aircraft radio at the same time, the high impedance input of the Darlington amplifier being plugged into the audio output of the aircraft radio through plug 14.

Each of the earphone wearers is provided with a dynamic boom microphone (24A and 24B), these microphones being connected in series to the input of buffer amplifier $T_3$, $T_4$, through coupling capacitors $C_2$ and $C_3$. The output of the second stage $T_4$ of the buffer amplifier is coupled to the high-impedance input of the Darlington amplifier through a capacitor $C_4$ and a resistor 25 of high ohmic value (i.e., 100,000 ohms or higher), so that the buffer imposes no substantial load in the input of the Darlington circuit.

Thus with this dual-function adapter arrangement, the wearers of the head-sets can both listen to the output of the aircraft radio by inserting plug 14 into jack 13, and they can also talk to each other through their respective microphones. This arrangement makes it possible for the wearers to communicate with each other at normal voice levels despite the high level of ambient noise in the plane.

Third Embodiment

Figure 3:
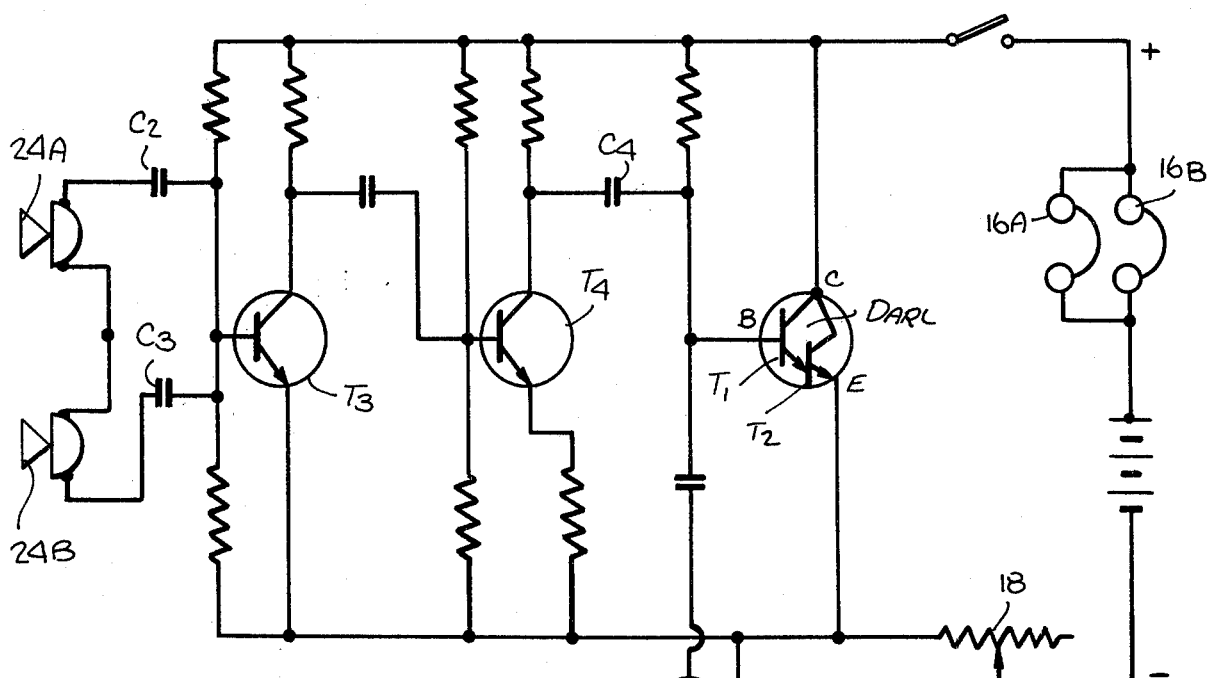
FIG. 3 is a schematic diagram of a second embodiment of the invention.
Figure 4:
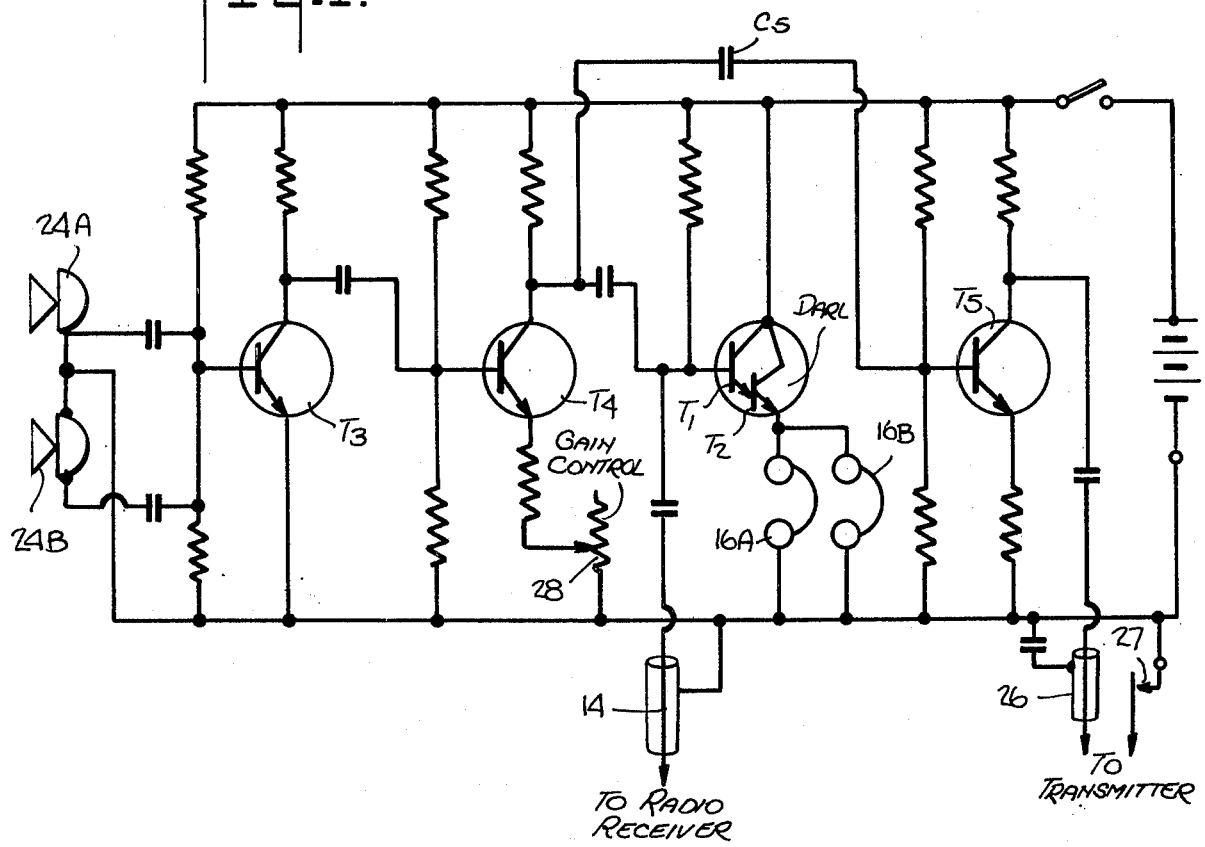
FIG. 4 is a schematic diagram of a third embodiment of the invention.

The arrangement shown in FIG. 4 adds still another feature to the intercom-adapter arrangement illustrated in FIG. 3. In this embodiment, the output of the second stage $T_4$ of the buffer amplifier is applied not only to the input of the Darlington circuit ($T_1$ and $T_3$), but through a coupling capacitor $C_5$ it is also applied to the input of a third buffer amplifier stage $T_5$. The output of stage $T_5$ is connected to a plug 26 which is insertable into the input jack of the transmitter of the aircraft radio, a push-to-talk switch 27 being provided. When this switch is actuated, it permits either head-set wearer provided with a microphone (24A and 24B) to communicate over the aircraft transmitter, and to listen for responses on the aircraft receiver.

The purpose of the third buffer stage is to raise the level of amplification to a degree necessary for feeding the aircraft transmitter, buffer amplifier gain being adjusted by a potentiometer 28. In this way, the adapter, which may be highly-compact (all components and the battery being housed in a small box), serves three distinct functions, namely: to enable one to use a headset for listening to the audio output of the aircraft radio, to enable intercommunication between two headset wearers, and to permit the headset wearers to transmit over the aircraft transmitters.

While there have been shown and described preferred embodiments of an earphone adapter for airplane radios in accordance with the invention, it will be appreciated that many changes and modifications may be made therein without, however, departing from the essential spirit thereof.

I claim:

1. An adapter making it possible to couple two sets of earphones to the relatively low-impedance output of an aircraft navigation-communication system without adversely affecting the operation of a loudspeaker already coupled to the same low impedance output, so that a wearer of the set can listen without difficulty to the system despite ambient noise that may impair the understandability of intelligence emitted by the loudspeaker, said adaptor comprising:

A. a battery-operated transistorized audio amplifier whose input circuit has an extremely high impedance and whose output circuit has a relatively low impedance, said amplifier having first and second transistors in a Darlington configuration in which the emitter of the first transistor is connected to the base of the second transistor, said amplifier having a high gain and including a volume control;

B. means including a d-c blocking capacitor for connecting the high-impedance input circuit of said amplifier to the low-impedance output circuit of said system to create a gross mismatch in impedance therebetween whereby virtually no load is imposed on the system, the resultant low level input signal fed to said amplifier by reason of said mismatch being compensated for by said high gain;

C. means connecting two sets of earphones to the output circuit of said amplifier; and
D. a buffer amplifier whose input is coupled to two microphones, one serving a first wearer of one set of said earphones and the other a second wearer of the other set of earphones, the output of the buffer amplifier being connected to the input circuit of the transistorized audio amplifier through a high impedance, whereby the adapter also functions as an intercom between said wearers without imposing a significant load on said system.

2. An amplifier as set forth in claim 1, wherein said volume control is a variable resistor in series with the earphones, whereby a reduction in volume results in a reduction in current drain.

3. An amplifier as set forth in claim 1, wherein said adapter is housed in a compact box having a plug extending therefrom which is insertable in the phone jack of the system and is provided with a phone jack for receiving the plug of the earphones.

4. An adapter as set forth in claim 3, wherein the amplifier is powered by either one of a pair of battery cells disposed in said box and further including a multi-purpose switch to connect in its first and second operative positions either cell to the amplifier and in its third operative position both cells in series.

5. An adapter as set forth in claim 1, further including means to couple the output of said buffer amplifier to the transmitter of said aircraft communication system, whereby either wearer can transmit over his microphone.

* * * * *